US012671391B2

(12) United States Patent
Huang et al.

(10) Patent No.: US 12,671,391 B2
(45) Date of Patent: Jun. 30, 2026

(54) ULTRAMINIATURE TUNING FORK QUARTZ CRYSTAL HAVING GROOVE GROUPS FOR FILLING CONDUCTIVE SILVER GLUE AND RESONATOR USING SAME

(71) Applicant: Taijing Technology Co., Ltd., Suizhou (CN)

(72) Inventors: Dayong Huang, Suizhou (CN); Yu Mao, Suizhou (CN); Xiangmiao Huang, Suizhou (CN); Xiaoming Sun, Suizhou (CN)

(73) Assignee: Taijing Technology Co., Ltd., Suizhou (CN)

( * ) Notice: Subject to any disclaimer, the term of this patent is extended or adjusted under 35 U.S.C. 154(b) by 814 days.

(21) Appl. No.: 18/107,204

(22) Filed: Feb. 8, 2023

(65) Prior Publication Data

US 2024/0120902 A1      Apr. 11, 2024

(30) Foreign Application Priority Data

Oct. 11, 2022    (CN) .......................... 202211239282.1

(51) Int. Cl.
*H03H 9/215*          (2006.01)
*H03H 9/05*          (2006.01)
*H03H 3/02*          (2006.01)

(52) U.S. Cl.
CPC .......... *H03H 9/215* (2013.01); *H03H 9/0547* (2013.01); *H03H 9/0595* (2013.01); *H03H 2003/026* (2013.01)

(58) Field of Classification Search
CPC .... H03H 9/215; H03H 9/0547; H03H 9/0595; H03H 9/0504; H03H 9/1014; H03H 2003/026; Y02D 30/70
See application file for complete search history.

(56) References Cited

U.S. PATENT DOCUMENTS 9,209,381 B2 * 12/2015 Kawashima ....... H03H 9/02157

FOREIGN PATENT DOCUMENTS

CN          213846635 U  *  7/2021
JP          2014150422 A  *  8/2014

OTHER PUBLICATIONS

Machine translation to English of JP-2014150422-A (Year: 2014).*
Machine translation to English of CN-213846635-U (Year: 2021).*

* cited by examiner

*Primary Examiner* — Emily P Pham
(74) *Attorney, Agent, or Firm* — WPAT, PC

(57)          ABSTRACT

Disclosed is an ultraminiature tuning fork quartz crystal and a resonator, the ultraminiature tuning fork quartz crystal comprises a tuning fork assembly, the tuning fork assembly comprises a fixing block, two vibrating parts and a connecting part, both of the vibrating parts extend outward and are symmetrically set through the fixing block and are connected to the fixing block, the connecting part comprises two connecting arms, and both of the connecting arms extend outward and are symmetrically set through the fixing block and are connected to the fixing block; an outer wall of the connecting arms is provided with at least one groove group for filling conductive silver glue, each groove in the groove group penetrates two adjacent sidewalls of the connecting arms. This disclosure can solve the problem that opening holes at the connecting end of the electrical connecting arms will weaken the strength of the electrical connecting arms.

10 Claims, 7 Drawing Sheets

ULTRAMINIATURE TUNING FORK QUARTZ CRYSTAL HAVING GROOVE GROUPS FOR FILLING CONDUCTIVE SILVER GLUE AND RESONATOR USING SAME

FIELD OF THE DISCLOSURE

The disclosure relates to the technical field of crystal oscillator, in particular to an ultraminiature tuning fork quartz crystal and a resonator.

BACKGROUND

Tuning fork crystal resonator has low power consumption of only a few microwatts, and few frequency-division triggers are used for timing. When the system is dormant, a button battery can work for 5 to 7 years. Tuning fork crystal resonator is a core device for working in the power saving mode of the system and awakening. Therefore, tuning fork crystal resonator is widely used in electronic systems such as mobile phones, computers, smart bracelets, smart home appliances, health care devices, watches, and clocks.

At present, in order to solve the problem of poor connection between the tuning fork crystal chip and the base of the resonator, related research and technology have emerged. For example, Chinese patent CN202023102367.4 with a title of ultra-fine thin tuning fork crystal chip and tuning fork crystal resonator discloses a tuning fork crystal chip, which comprises a fixed part, a vibration part extending outward through one end of the fixed part, and an electrical connection part. The vibration part comprises two vibration arms, and the electrical connection part comprises two electrical connection arms. The opposite sides of the connecting end of the electrical connecting arms gradually shrink towards the extension direction of the electrical connecting arms to form a sharp corner connecting end. The upper and lower surfaces of the electrical connecting arm near the sharp corner connecting end are penetrated with a support arm through hole, and a silver glue penetration cavity is formed in the support arm through hole. The sharp corner connecting end can facilitate the silver glue to infiltrate around the sharp corner connecting end to achieve wrapping, and at the same time, the silver glue can penetrate into the support arm through hole to improve the tightness of the connection between the silver glue and the electrical connecting arms. However, in the device, the supporting arm through-holes for filling conductive silver glue is set at the sharp corner connection end of the electrical connecting arms, which will weaken the strength of the electrical connecting arm, thus reducing the service life of the tuning fork crystal chip.

Therefore, there is an urgent need for an ultraminiature tuning fork quartz crystal and a resonator to solve the problem that in the prior art, opening holes at the connecting end of the electrical connecting arms will weaken the strength of the electrical connecting arms, thereby reducing the service life of the tuning fork crystal chip.

SUMMARY

The purpose of this disclosure is to provide an ultraminiature tuning fork quartz crystal and a resonator to overcome the above technical problems that in the prior art, opening holes at the connecting end of the electrical connecting arms will weaken the strength of the electrical connecting arms, thereby reducing the service life of the tuning fork crystal chip.

This disclosure provides an ultraminiature tuning fork quartz crystal, which comprises a tuning fork assembly, the tuning fork assembly comprises a fixing block, two vibrating parts and a connecting part, both of the vibrating parts extend outward and are symmetrically set through the fixing block and are connected to the fixing block, the connecting part comprises two connecting arms, and both of the connecting arms extend outward and are symmetrically set through the fixing block and are connected to the fixing block; the connecting arms are further away from central axis of the fixing block than the vibrating parts;

An outer wall of the connecting arms is provided with at least one groove group for filling conductive silver glue, each groove in the groove group penetrates two adjacent sidewalls of the connecting arms.

This disclosure also provides a resonator, comprising a base assembly and the ultraminiature tuning fork quartz crystal.

Compared with the prior art, the beneficial effects of this disclosure are: both of the vibrating parts and the connecting part are extended outward through the fixing block and are connected to the fixing block to form a symmetrical structure of tuning fork quartz crystal chip. The outer walls of the connecting arms are provided with at least one groove group for filling conductive silver glue, which is used to improve the tightness of connecting arms and conductive silver glue, so as to strengthen the connection between the connecting arms and the base of the resonator. Compared with the prior art, the groove group plays a guiding role in the flow of the conductive silver glue. The conductive silver glue soaks the connecting arms through the groove group to enhance the connection between conductive silver glue and the connecting arms, and the conductive silver glue flows through the groove group again to wrap the solidified conductive silver glue filled in the groove group. This increases the tightness between connecting arms and the base of the resonator, while also avoiding the problem of weakened arms strength due to opening holes.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The technical solutions in the embodiments of the application will be described clearly and completely in combination with the drawings in the embodiments of the application.

Figure 1:
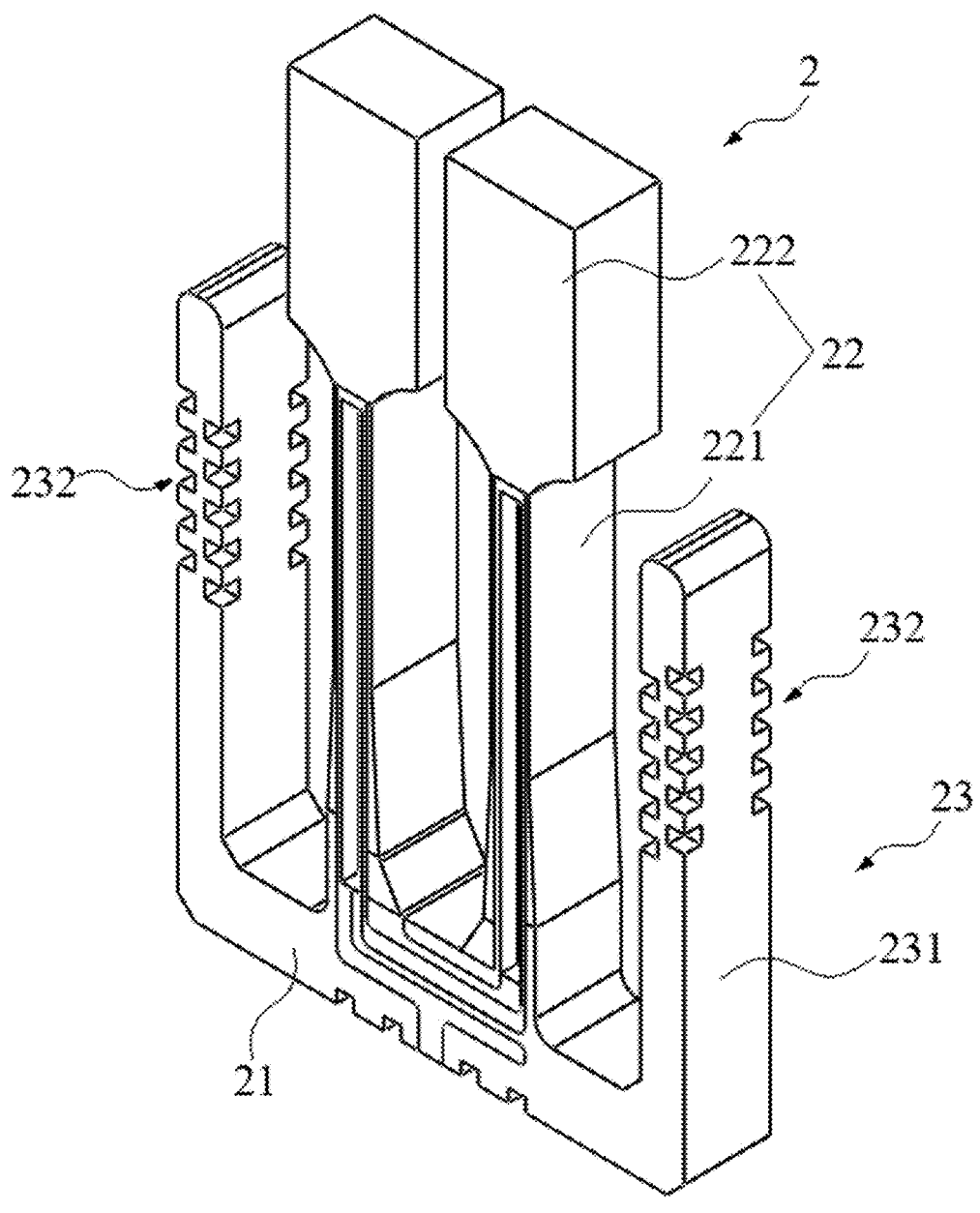
FIG. 1 is a schematic diagram of the three-dimensional structure of an ultraminiature tuning fork quartz crystal provided by an embodiment of this disclosure.
Figure 2:
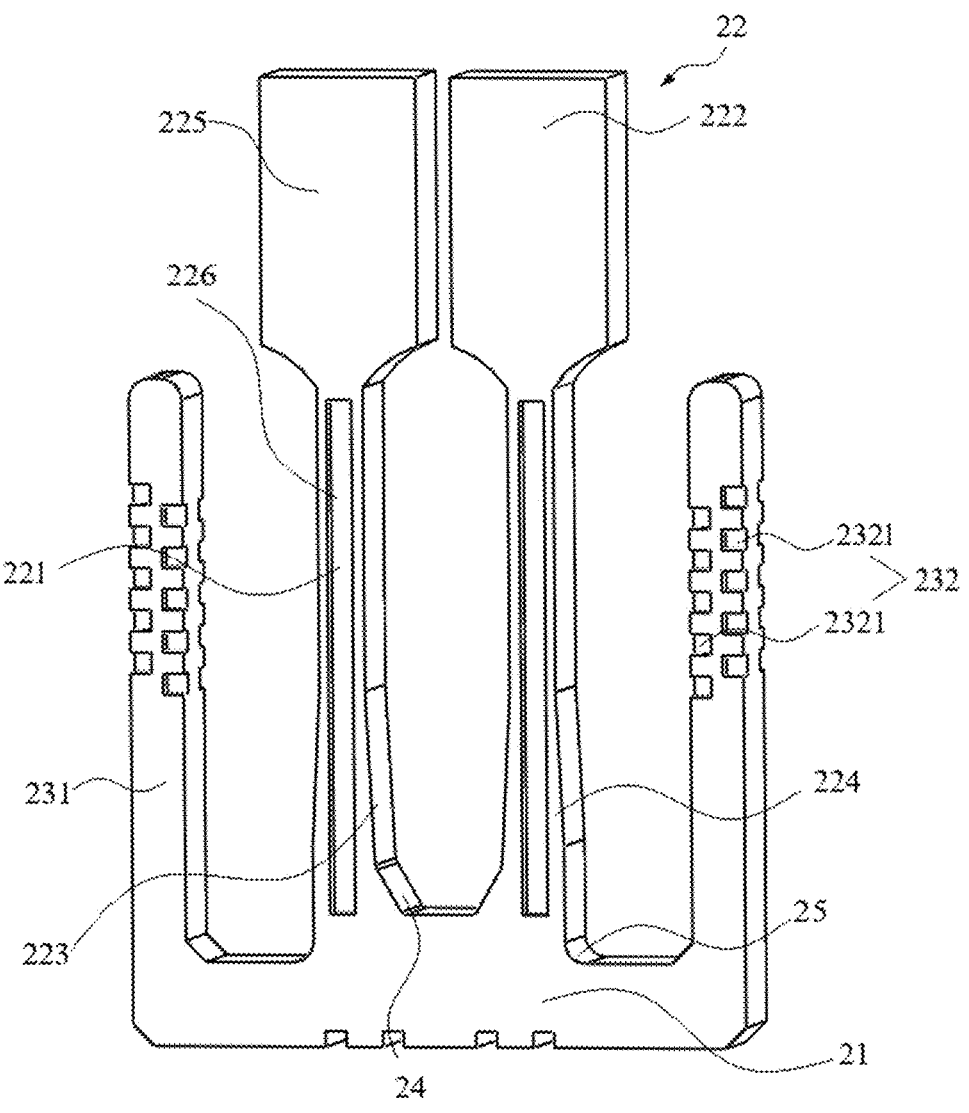
FIG. 2 is a schematic diagram of the three-dimensional structure of FIG. 1 at another viewing angle.

As shown in FIG. 1 and FIG. 2, this disclosure provides an ultraminiature tuning fork quartz crystal, comprising a tuning fork assembly 2 for forming a tuning fork crystal chip. The tuning fork assembly 2 includes a fixing block 21, two vibrating parts 22 and a connecting part 23. Both of the vibrating parts 22 extend outward and are symmetrically set through the fixing block 21 and are connected to the fixing block 21. The connecting part 23 comprises two connecting arms 231, and both of the connecting arms 231 extend outward and are symmetrically set through the fixing block 21 and are connected to the fixing block 21. The connecting arms 231 are further away from central axis of the fixing block 21 than the vibrating parts 22. An outer wall of the connecting arms 231 is provided with at least one groove group 232 for filling conductive silver glue to improve the tightness of the connecting arms 231 and the conductive silver glue.

In this device, both of the vibrating parts 22 and the connecting part 23 are extended outward through the fixing block 21 and are connected to the fixing block 21 to form a symmetrical structure of tuning fork quartz crystal chip. The outer walls of the connecting arms 231 are provided with at least one groove group 232 for filling conductive silver glue, which is used to improve the tightness of connecting arms 231 and conductive silver glue, so as to strengthen the connection between the connecting arms 231 and the base of the resonator. Compared with the prior art, the groove group 232 plays a guiding role in the flow of the conductive silver glue. The conductive silver glue soaks the connecting arms 231 through the groove group 232 to enhance the connection between conductive silver glue and the connecting arms 231, and the conductive silver glue flows through the groove group 232 again to wrap the solidified conductive silver glue filled in the groove group 232. This increases the tightness between connecting arms 231 and the base of the resonator, while also avoids the problem of weakened arms 231 strength due to opening holes.

Furthermore, the connection between the tuning fork crystal chip and the base usually includes bonding and welding. The conductive silver glue combines conductive particles together through the bonding of matrix resin to form a conductive path and realize the conductive connection of the bonded material.

It can be understood that in this embodiment, the thickness of the tuning fork crystal chip is 60 to 120 microns, and the tuning fork crystal chip can be used on the crystal resolver with package size of 1 to 2 mm Specifically, the thickness of the tuning fork crystal chip is gradually reduced through grinding, polishing, and chemical corrosion thinning processes. The reduction of the thickness reduces the electric resistance and increases the quality factor Q. The thickness reduction of tuning fork crystal chip is more conducive to miniaturization. The quartz chip corrosion molding process is a common setting known to those skilled in the art, and will not be described here.

Figure 7:
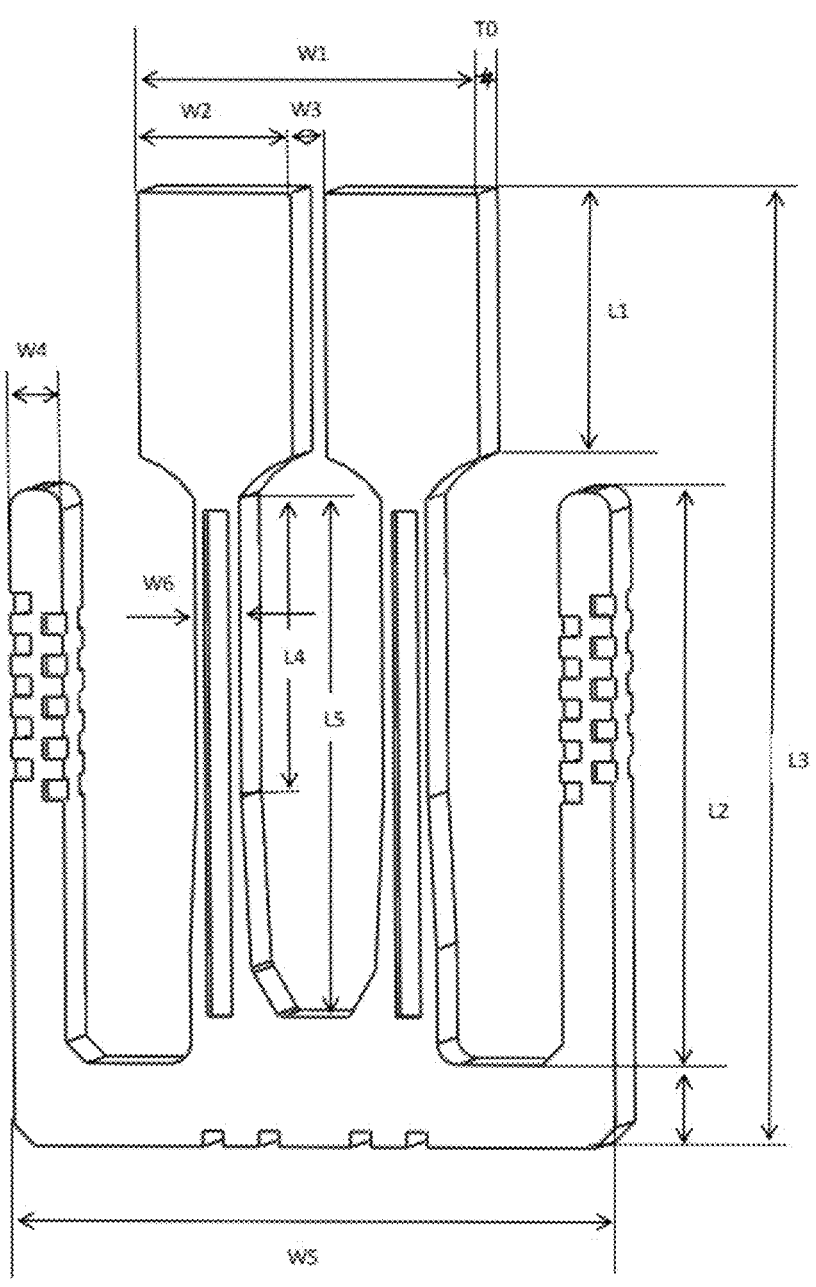
FIG. 7 is a dimensional schematic diagram of the ultraminiature tuning fork quartz crystal in FIG. 1.

Specifically, as shown in FIG. 7, the sizes of the first and second types of the tuning fork quartz crystals in this disclosure are provided, and Table 1 below shows the size values corresponding to the first and second types in this disclosure.

TABLE 1

| Size | First type | Second type |
|------|-----------|-------------|
| T0 | 60~120 μm | 60~120 μm |
| W1 | 330~335 μm | 315 μm |
| W2 | 150 μm | 135 μm |
| W3 | 30 μm | 45 μm |
| W4 | 50 μm | 70 μm |
| W5 | 560 μm | 570 μm |
| W6 | 40 μm | 65 μm |
| L1 | 250 μm | 298 μm |
| L2 | 550 μm | 713 μm |
| L3 | 920 μm | 1178 μm |
| L4 | 290 μm | 131 μm |
| L5 | 550 μm | 660 μm |

As shown in FIG. 2, the groove group 232 includes four first grooves 2321, the first grooves 2321 are evenly arranged along the outer wall of the connecting arms 231, and each of the first groove 2321 penetrates the two adjacent sidewalls of the connecting arms 231.

It can be understood that the four first grooves 2321 are respectively set on the four side walls of the connecting arms 231, and each of the first groove 2321 penetrates the two side walls adjacent to the connecting arms 231, which is used to guide the flow of the conductive silver glue.

As a preferred implementation, the four first grooves 2321 are interleaved to avoid weakening the connecting arms 231 due to slotting.

Specifically, both of the first grooves 2321 located on the same side of the device and both of the first grooves 2321 located on the opposite side are interlaced with each other, and the arrangement can also be other types.

Preferably, in order to improve the connection strength between the conductive silver glue and the connecting arms 231, the number of groove groups 232 in the connecting arms 231 is multiple, and multiple groove groups 232 are uniformly set along the extension direction of the connecting arms 231.

Comparative Embodiment 1

The groove group 232 on the connecting arms 231 for containing the conductive silver glue is replaced by through holes opened on the connecting arms 231.

Comparative Embodiment 2

The groove group 232 on the connecting arms 231 for containing the conductive silver glue is replaced by a single groove arranged on one side of the connecting arms 231.

Comparative Embodiment 3

The groove group 232 on the connecting arms 231 for containing the conductive silver glue is replaced by single grooves arranged on both sides of the connecting arms 231.

TABLE 2

| Group | Corrosion time (h) | Strength (yield rate) |
|-------|--------------------|-----------------------|
| Comparative Embodiment 1 | 5 | 92.80% |
| Comparative Embodiment 2 | 1.7 | 96.50% |
| Comparative Embodiment 3 | 2.5 | 97.70% |
| Embodiment | 2.5 | 97.80% |

Among them, the corrosion time (h) in Table 2 represents the time it takes to etch holes or grooves on the surface of the quartz wafer, and strength (yield rate) is expressed as the yield rate of 1000 processed quartz wafers without damage after drop test under the same conditions.

Therefore, according to the comparison data in Table 2 above, it is better to have at least one groove group 232 on both sides of the connecting arms 231.

Specifically, the width and depth of the first groove 2321 in this disclosure are both 20 microns.

Comparative Embodiment 1

The width and depth dimensions of the first groove 2321 are replaced by 10 microns and 10 microns.

Comparative Embodiment 2

The width and depth dimensions of the first groove 2321 are replaced by 30 microns and 30 microns.

TABLE 3

| Group | Corrosion time (h) | Strength (yield rate) |
|---|---|---|
| Comparative Embodiment 1 | 4.7 | 98.30% |
| Comparative Embodiment 2 | 1.8 | 95.20% |
| Embodiment | 2.5 | 97.60% |

Among them, the corrosion time (h) in Table 3 represents the time it takes to etch holes or grooves on the surface of the quartz wafer, and strength (yield rate) is expressed as the yield rate of 1000 processed quartz wafers without damage after drop test under the same conditions.

Therefore, according to the comparison data in Table 3 above, the first groove 2321 with a width size of 20 microns and a depth size of 20 microns is preferred.

Figure 3:
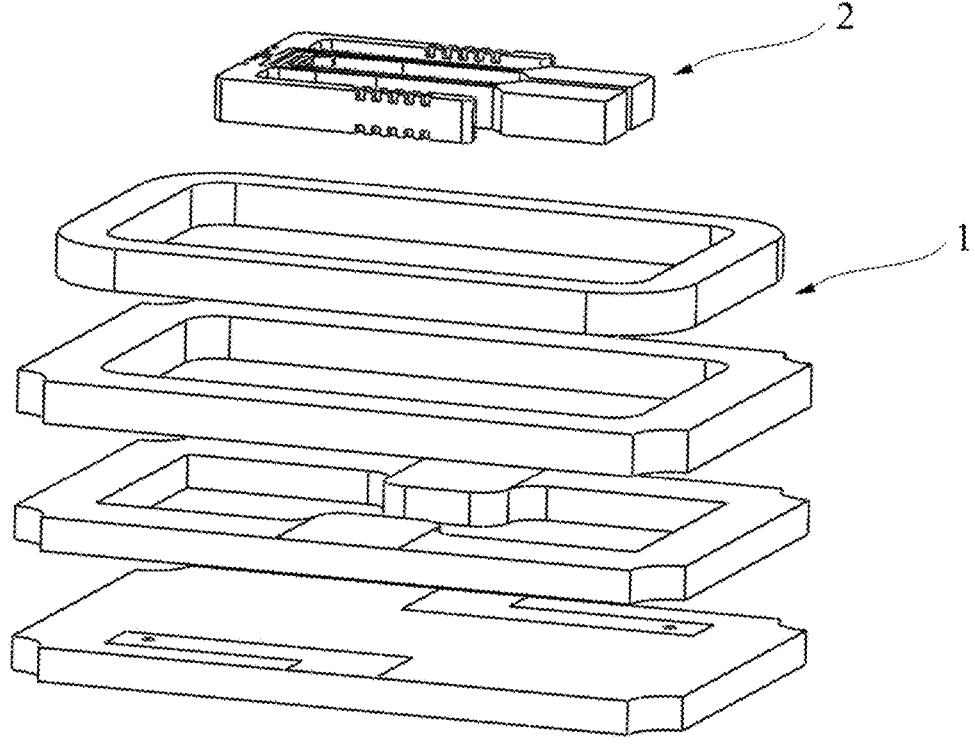
FIG. 3 is a three-dimensional exploded view of the resolver provided by an embodiment of this disclosure.

As shown in FIG. 1 and FIG. 3, each of the vibrating parts 22 comprises a first vibration arm 221, a second vibration arm 222, a first connecting plate 223, and a second connecting plate 224, wherein the first connecting plate 223 and the second connecting plate 224 are both connected to the first vibration arm 221.

The first vibration arm 221 and the second vibration arm 222 are arranged in turn, and the second vibration arm 222 is connected to the fixing block 21 by the first vibration arm 221.

It can be understood that the first vibration arm 221 and the second vibration arm 222 together form the arm of the quartz crystal. The second vibration arm 222 is farther away from fixing block 21 than the first vibration arm 221, where the second vibration arm 222 is the second vibration arm part of the vibrating parts 22, which acts as a frequency reduction, weighting, and frequency modulation. The first vibration arm 221 is the first vibration arm of vibrating parts 22, which is used as the vibration bending part after applying electric field force.

Furthermore, the vibrating parts 22 plays the role of laser frequency modulation during the vibration process, which can be used to increase the electrode area, reduce the dynamic resistance, and improve the quality factor Q value of the tuning fork crystal chip, which is a well-known routine setting for technicians in this field.

As shown in FIG. 2, the first connecting plate 223 and the first vibration arm 221 are set one by one. The two first connecting plates 223 are respectively set on the opposite side of the two first connecting plates 223, and both are connected to the first vibration arm 221. The second connecting plate 224 and the first vibration arm 221 are set one by one, and the second connecting plate 224 is set relative to the connecting arms 231 and connected to the first vibration arm 221.

It can be understood that the settings of the first connecting plate 223 and the second connecting plate 224 strengthen the connection and support between the vibrating parts 22 and the fixing block 21.

As an embodiment, the first connecting plate 223 and the second connecting plate 224 gradually shrink in the direction close to the second vibration arm 222, and form a first slope and a second slope with the outer wall of the first vibration arm 221, respectively.

It can be understood that the transition settings of the first slope and the second slope can avoid stress concentration, so that the vibration between the vibrating parts 22 and the fixing block 21 has less impact, and the tuning fork has more anti vibration characteristics, which will not be described too much here.

As a better embodiment, the angle between the first slope and the central axis of the fixing block 21 is 13° to 17°. The angle between the second slope and the central axis of the fixing block 21 is also 13° to 17°.

Comparative Embodiment 1

The connection between fixing block 21 and first vibration arm 221 is replaced by: first connecting plate 223 and second connecting plate 224 are not set.

Comparative Embodiment 2

The connection between fixing block 21 and first vibration arm 221 is replaced by: only the first connecting plate 223 is set.

Comparative Embodiment 3

The connection between fixing block 21 and first vibration arm 221 is replaced by: only the second connecting plate 224 is set.

TABLE 4

| Group | Shock resistance (yield) |
|---|---|
| Comparative Embodiment 1 | 92.80% |
| Comparative Embodiment 2 | 96.70% |
| Comparative Embodiment 3 | 97.10% |
| Embodiment | 97.80% |

Among them, the shock resistance (yield) in Table 4 is expressed as the yield rate of 1000 processed quartz wafers without damage after drop test under the same conditions.

Therefore, from the comparison data in Table 4 above, it is better to set the first connecting plate 223 and the second connecting plate 224 on both sides of the first vibration arm 221 and the fixing block 21 respectively.

Comparative Embodiment 1

The angle between the second slope and the central axis of the fixing block 21 is replaced by: less than 13°;

Comparative Embodiment 1

The angle between the second slope and the central axis of the fixing block 21 is replaced by: more than 13°.

7

TABLE 5

| Group | Strength (yield rate) |
|---|---|
| Comparative Embodiment 1 | 95.20% |
| Comparative Embodiment 2 | 96.60% |
| Embodiment | 97.80% |

Among them, the strength (yield rate) in Table 5 is expressed as the yield rate of 1000 processed quartz wafers without damage after drop test under the same conditions.

Therefore, based on the comparison in Table 5, it is preferable to set the angle between the first connecting plate 223 and the central axis between 13° and 17°, and to set the angle between the second connecting plate 224 and the central axis between 13° and 17°.

As shown in FIG. 2, a first slope transition section is formed at the junction between the first connecting plate 223 and the fixing block 21, and a first arc transition section is formed at the junction between the second connecting plate 224 and the fixing block 21.

Comparative Embodiment 1

The transition area of the fixing block 21 and the first connecting plate 223 is replaced by: right angle transition.

Comparative Embodiment 2

The transition area of the fixing block 21 and the second connecting plate 224 is replaced by: right angle transition.

TABLE 6

| Group | Shock resistance (yield) |
|---|---|
| Comparative Embodiment 1 | 94.30% |
| Comparative Embodiment 2 | 90.50% |
| Embodiment | 97.80% |

Among them, the shock resistance (yield) in Table 6 is expressed as the yield rate of 1000 processed quartz wafers without damage after drop test under the same conditions.

Therefore, according to the comparison data in Table 6 above, it is preferable to have a first slope transition section formed at the junction between the first connecting plate 223 and the fixing block 21, and a first arc transition section formed at the junction between the second connecting plate 224 and the fixing block 21

Similarly, the bottom of the fixing block 21 is also provided with chamfers to avoid problems such as irregular size caused by corrosion, so as to facilitate production.

Figure 6:
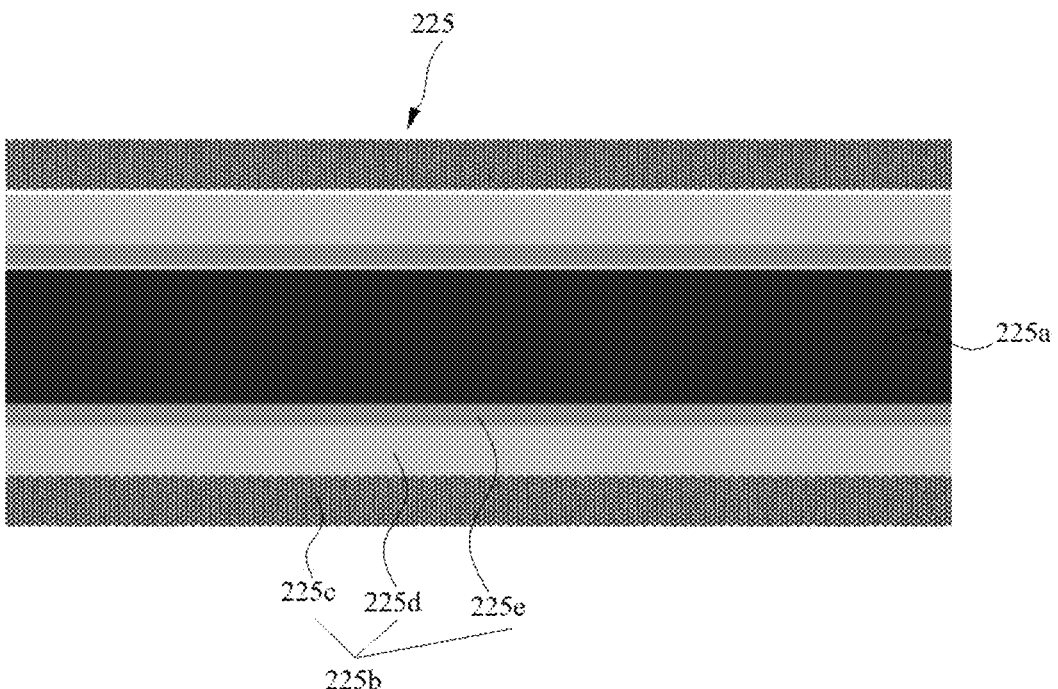
FIG. 6 is a structural diagram of the tuning fork crystal chip laser frequency modulation section of the resolver in FIG. 5.

As shown in FIG. 6, the free ends of the two vibrating parts 22 are formed with a laser frequency modulation section 225. The laser frequency modulation section 225 comprises a crystal layer 225a and high-temperature vaporization layers 225b formed on the upper and lower surfaces of the crystal layer 225a. The high-temperature vaporization layers 225b comprises a metal primer 225c, a first metal weighting layer 225d and a second metal weighting layer 225e arranged from inside to outside. The metal primer 225c is attached to the crystal layer 225a, density of the first metal weighting layer 225d is greater than that of the second metal weighting layer 225e. In this embodiment, the metal primer 225c is a chromium layer, the first metal weighting layer 225d is a gold layer, and the second metal weighting layer 225e is a silver layer.

In specific applications, a picosecond laser is used to vaporize the high-temperature vaporization layers 225b at high temperature. First, the high-temperature vaporization layer 225b on the upper surface are vaporized at high temperature by the picosecond laser. After the upper layer vaporizes, the high-temperature vaporization layer 225b on the lower surface are vaporized by the picosecond laser through the crystal layer 225a. The layered layout reduces the quality of the vibrating parts, and the resonant frequency will increase. The target value can be reached by multiple laser adjustments. In practical application, there is no electrical connection between the high-temperature vaporization layers 225b and a vibration arm connecting section. Compared with the prior art that only a gold weighting layer is set, this disclosure sets a gold layer of the first metal weighting layer 225d on the basis of the chrome layer of the primer, and further plating a silver layer of the second metal weighting layer 225e. On the one hand, this setting reduces the quality of the resonance arm, on the other hand, the use of the silver layer reduces manufacturing cost.

It can be understood that the two vibrating parts 22 both comprise the vibration arm connecting section 226 and the laser frequency modulation section 225, wherein the laser frequency modulation section 225 and the vibration arm connection section 226 correspond to the first vibration arm 221 and the second vibration arm 222 respectively, and the laser frequency modulation section 225 shrinks towards the end of the vibration arm connection section 226 to form a transition section with relative setting. And/or, the inner wall of the vibration arm connecting section 226 near the fixing block 21 is connected with the first connecting plate 223 and the second connecting plate 224, and the first slope transition section 24 and the first arc transition section 25 are formed. That is, the first slope transition section 24 and the first arc transition section 25 increase electrode area, reduce dynamic resistance, and improve the quality factor Q value of the tuning fork crystal chip. This makes the tuning fork (laser frequency modulation section 225) can effectively reduce the mechanical vibration transmitted to the base 11 through the vibration arm connection section during the vibration. The vibration force rapidly attenuates in the first slope transition section 24 and the first arc transition section 25, and improves the stability of the tuning fork vibration and the stability of the output frequency. The empirical formula of the above dynamic resistance is:

$$R1 = \frac{t^3 \gamma}{8A\delta^2}$$

where R1 is the dynamic resistance, t is the thickness of tuning fork crystal chip, y is the damping coefficient, A is the electrode area, δ is the spatial polarizability. It can be seen from the above formula that the dynamic resistance R1 decreases when the electrode area A increases, which means the resistance value decreases.

Figure 4:
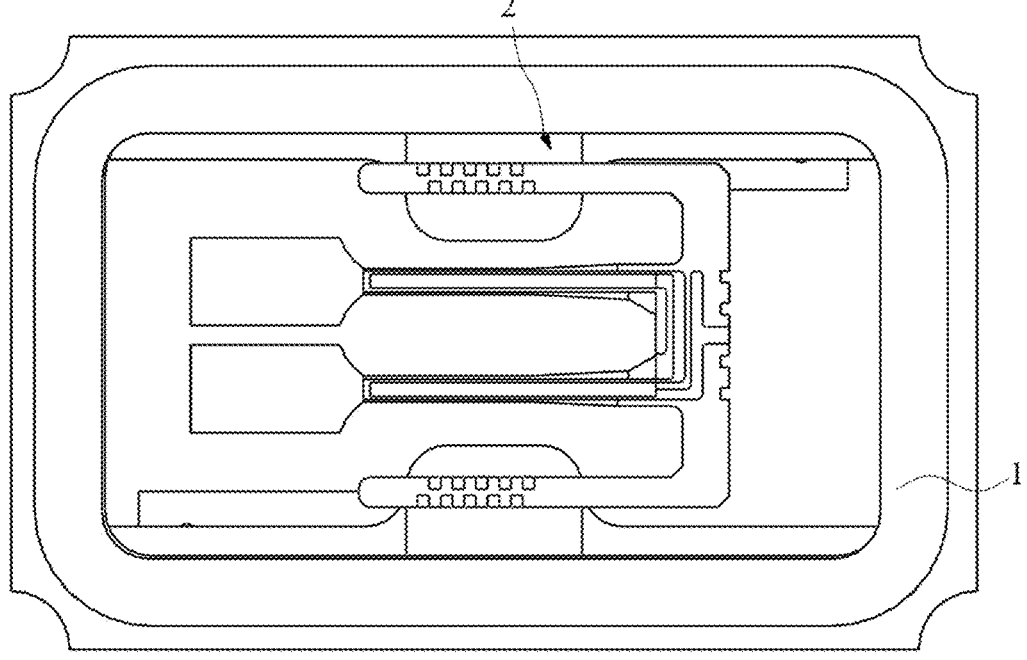
FIG. 4 is a top view of FIG. 3.
Figure 5:
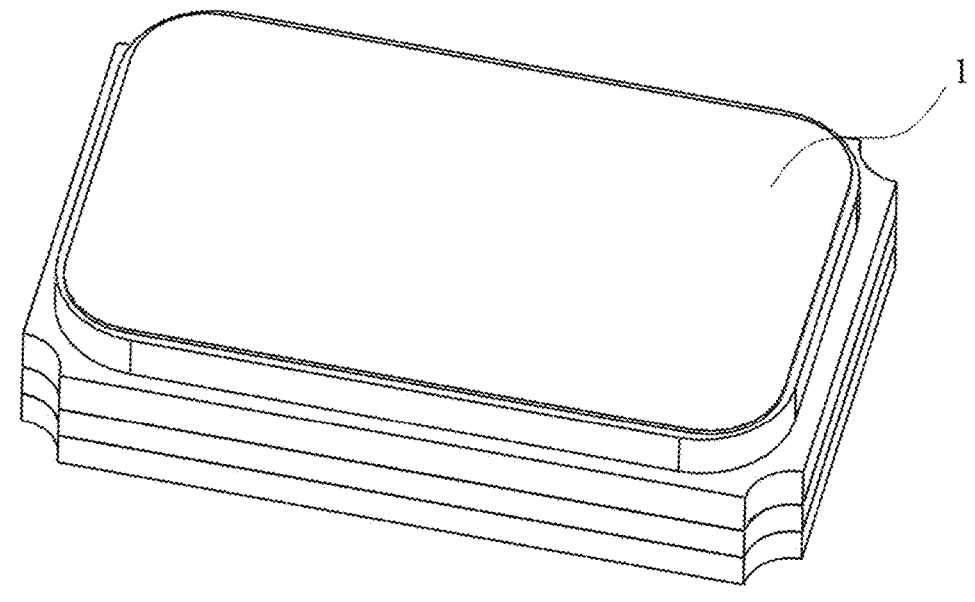
FIG. 5 is a structural diagram of the resolver in FIG. 3.

As shown in FIG. 3 to FIG. 5, this disclosure also provides a resonator, comprising a base assembly 1 and the ultraminiature tuning fork quartz crystal as described above.

It can be understood that the ultraminiature tuning fork quartz crystal is bonded with the base assembly 1 to form a resonator, wherein the base assembly 1 comprises a base formed by a multi-layer ceramic cavity tube shell and a metal upper cover, and the ultraminiature tuning fork quartz crystal chip is sealed in a multi-layer ceramic cavity tube shell.

The specific workflow of this disclosure is as follows: both of the vibrating parts 22 and the connecting part 23 are extended outward through the fixing block 21 and are connected to the fixing block 21 to form a symmetrical structure of tuning fork quartz crystal chip. The outer walls of the connecting arms 231 are provided with at least one groove group 232 for filling conductive silver glue, which is used to improve the tightness of connecting arms 231 and conductive silver glue, so as to strengthen the connection between the connecting arms 231 and the base of the resonator. Compared with the prior art, the groove group 232 plays a guiding role in the flow of the conductive silver glue. The conductive silver glue soaks the connecting arms 231 through the groove group 232 to enhance the connection between conductive silver glue and the connecting arms 231, and the conductive silver glue flows through the groove group 232 again to wrap the solidified conductive silver glue filled in the groove group 232. This increases the tightness between connecting arms 231 and the base of the resonator, while also avoiding the problem of weakened arms 231 strength due to opening holes.

When in use, first dropping conductive silver glue on the base according to positioning judgment, then placing the conductive silver glue groove group 232 on the conductive silver glue, waiting for the conductive silver glue to air dry or using other means to promote its air drying, and then dropping conductive silver glue along the conductive silver glue groove group 232 for the second time, the conductive silver glue flows along the conductive silver glue groove group 232 and wraps the connecting arms 231, then waiting for the conductive silver glue to air dry or using other means to promote its air drying, and finally connecting the connecting arms 231 with the base through welding, thus completing the sealing of the ultraminiature tuning fork quartz crystal chip in the multi-layer ceramic cavity pipe shell in this disclosure.

The above structure can solve the problem that in the prior art, opening holes at the connection end of the connecting arms will weaken the connection strength, thereby reducing the service life of the tuning fork crystal chip.

It is to be understood, however, that even though numerous characteristics and advantages of this disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An ultraminiature tuning fork quartz crystal, comprising a tuning fork assembly, the tuning fork assembly comprises a fixing block, two vibrating parts, and a connecting part, both of the two vibrating parts extend outward and are symmetrically set through the fixing block and are connected to the fixing block, the connecting part comprises two connecting arms, and both of the two connecting arms extend outward and are symmetrically set through the fixing block and are connected to the fixing block; the two vibrating parts are further away from central axis of the fixing block than the two vibrating parts;

an outer wall of each of the two connecting arms is provided with at least one groove group for filling conductive silver glue, each groove in the groove group penetrates two adjacent sidewalls of the two connecting arms.

2. The ultraminiature tuning fork quartz crystal according to claim 1, the at least one groove group includes four first grooves, the four first grooves are evenly arranged along the outer wall of the two connecting arms, and each of the four first grooves penetrates the two adjacent sidewalls of the two connecting arms.

3. The ultraminiature tuning fork quartz crystal according to claim 2, the four first grooves are interleaved.

4. The ultraminiature tuning fork quartz crystal according to claim 1, a number of groove groups in the two connecting arms is multiple, and multiple groove groups are uniformly set along extension direction of the two connecting arms.

5. The ultraminiature tuning fork quartz crystal according to claim 1, each of the vibrating parts two vibrating parts comprises a first vibration arm and a second vibration arm, the first vibration arm and the second vibration arm are arranged in turn, and the second vibration arm is connected to the fixing block by the first vibration arm.

6. The ultraminiature tuning fork quartz crystal according to claim 5, each of the two vibrating parts also comprises a first connecting plate and a second connecting plate, the first connecting plate and the first vibration arm are set one by one; the two first connecting plates are respectively set on the opposite side of the two first connecting plates, and both are connected to the first vibration arm; the second connecting plate and the first vibration arm are set one by one, and the second connecting plate is set relative to the two connecting arms and connected to the first vibration arm.

7. The ultraminiature tuning fork quartz crystal according to claim 6, the first connecting plate and the second connecting plate gradually shrink in a direction close to the second vibration arm, and form a first slope and a second slope with the outer wall of the first vibration arm, respectively.

8. The ultraminiature tuning fork quartz crystal according to claim 7, an angle between the first slope and the central axis of the fixing block is 13° to 17°;

an angle between the second slope and the central axis of the fixing block is also 13° to 17°.

9. The ultraminiature tuning fork quartz crystal according to claim 7, a first slope transition section is formed at a junction between the first connecting plate and the fixing block, and a first arc transition section is formed at a junction between the second connecting plate and the fixing block.

10. A resonator, comprising a base assembly and the ultraminiature tuning fork quartz crystal according to claim 1.

* * * * *